United States Patent
Liu

(10) Patent No.: US 11,892,902 B2
(45) Date of Patent: Feb. 6, 2024

(54) FIRMWARE REPAIR FOR THREE-DIMENSIONAL NAND MEMORY

(71) Applicant: Yangtze Memory Technologies Co., Ltd., Hubei (CN)

(72) Inventor: YanLan Liu, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 178 days.

(21) Appl. No.: 17/470,342

(22) Filed: Sep. 9, 2021

(65) Prior Publication Data

US 2022/0391280 A1     Dec. 8, 2022

Related U.S. Application Data

(63) Continuation of application No. PCT/CN2021/098277, filed on Jun. 4, 2021.

(51) Int. Cl.
| | |
|---|---|
| G06F 11/07 | (2006.01) |
| G11C 15/00 | (2006.01) |
| G11C 16/04 | (2006.01) |
| G11C 16/08 | (2006.01) |
| G11C 16/24 | (2006.01) |
| G11C 16/26 | (2006.01) |

(52) U.S. Cl.
CPC ........ G06F 11/0793 (2013.01); G06F 11/073 (2013.01); G11C 15/00 (2013.01); G11C 16/0483 (2013.01); G11C 16/08 (2013.01); G11C 16/24 (2013.01); G11C 16/26 (2013.01)

(58) Field of Classification Search
CPC .... G06F 11/073; G06F 11/0793; G11C 15/00; G11C 16/0483; G11C 16/08; G11C 16/24; G11C 16/26

USPC .................................................. 714/6.1, 6.11
See application file for complete search history.

(56) References Cited

U.S. PATENT DOCUMENTS

| | | |
|---|---|---|
| 6,480,931 B1 | 11/2002 | Buti et al. |
| 7,016,243 B1 | 3/2006 | Srinivasan et al. |
| 2004/0085825 A1 | 5/2004 | Narita et al. |

(Continued)

OTHER PUBLICATIONS

International Search Report of the International Searching Authority directed to related International Patent Application No. PCT/CN2021/098277, dated Mar. 2, 2022; 5 pages.

*Primary Examiner* — Chae M Ko
(74) *Attorney, Agent, or Firm* — Sterne, Kessler, Goldstein & Fox P.L.L.C.

(57) ABSTRACT

The present disclosure provides a content addressable memory (CAM) for repairing firmware of multi-plane read operations in a flash memory device. The CAM comprises a set of CAM registers configured to store a mapping table. The mapping table comprises a plurality of old addresses, each old address corresponding to a new address. The CAM also comprises N comparators coupling to the set of CAM registers, and configured to compare the old addresses with N input signals for performing the multi-plane read operations on N memory planes, wherein N is an integer greater than 1. The CAM further comprises N multiplexers coupling to the N comparators respectively and to the set of CAM registers, and configured to generate N output signals for the multi-plane read operations. At least one of the N output signals comprises the new address according to the mapping table and a comparison output by the comparators.

20 Claims, 12 Drawing Sheets

(56) References Cited

U.S. PATENT DOCUMENTS

| | | |
|---|---|---|
| 2005/0036363 A1 | 2/2005 | Shau |
| 2008/0232148 A1 | 9/2008 | Yabe |
| 2017/0220413 A1* | 8/2017 | Cha .................... G06F 3/064 |
| 2019/0362803 A1* | 11/2019 | Shibata .............. G11C 29/1201 |
| 2020/0327942 A1 | 10/2020 | Akel et al. |
| 2021/0026565 A1* | 1/2021 | Her .................... G06F 3/0604 |
| 2021/0295944 A1* | 9/2021 | Lim ................... G11C 29/4401 |

* cited by examiner

FIRMWARE REPAIR FOR THREE-DIMENSIONAL NAND MEMORY

CROSS-REFERENCE TO RELATED APPLICATIONS AND INCORPORATION BY REFERENCE

This application claims priority to PCT/CN2021/098277 filed on Jun. 4, 2021, which is incorporated herein by reference in its entirety.

TECHNICAL FIELD

The present disclosure generally relates to the field of semiconductor technology, and more particularly, to a design and a method of error correction in a 3D NAND memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of the memory cells in an entire memory page sharing the same word line can be read or programmed simultaneously. However, due to process variations, not every memory cell can be programmed to a target state or remain at the target state. Redundant memory cells or memory strings can be used to replace defective memory cells or memory strings. During a read operation, firmware of the 3D NAND can be repaired by replacing an address of a defective memory cell or a defective memory string with an address of a redundant memory cell or a redundant memory string. Traditionally, a content addressable memory (CAM) can be used to store a mapping table where an old address of a defective memory cell or memory string corresponds to a new address of a redundant memory cell or memory string.

To facilitate efficiency, a 3D NAND memory can perform multi-plane read operations, where memory pages in different memory planes can be read in parallel. While a CAM can be used to repair firmware during an individual read operation, multiple CAMs are needed to support the multi-plane read operations, which increases manufacturing cost. Therefore, a need exists for a design and a method to repair firmware for a 3D NAND memory so as to provide a low-cost but efficient solution for multi-plane read operations.

BRIEF SUMMARY

Embodiments of methods and circuits for firmware repair in a three-dimensional (3D) memory device is described in the present disclosure.

One aspect of the present disclosure provides a content addressable memory (CAM) for repairing firmware of multi-plane read operations in a flash memory device. The CAM comprises a set of CAM registers configured to store a mapping table. The mapping table comprises a plurality of old addresses, each old address corresponding to a new address. The CAM also comprises N comparators coupling to the set of CAM registers, and configured to compare the old addresses with N input signals for performing the multi-plane read operations on N memory planes, wherein N is an integer greater than 1. The CAM further comprises N multiplexers coupling to the N comparators respectively and to the set of CAM registers, and configured to generate N output signals for the multi-plane read operations. At least one of the N output signals comprises the new address according to the mapping table and a comparison output by the comparators.

In some embodiments, each of the N comparators is further configured to generate an output enablement signal; and send the output enablement signal to one of the N multiplexers.

In some embodiments, each of the N multiplexers is further configured to receive the output enablement signal sent by the comparator; and receive the new address stored in the mapping table.

In some embodiments, the output enablement signal indicates a matching status when an input address in the input signal matches one of the plurality of old addresses.

In some embodiments, the output enablement signal indicates NULL when the input address in the input signal does not match anyone of the plurality of old addresses.

In some embodiments, the input address in the input signal identifies a memory cell, a memory string, a memory page, a memory block or a memory plane in the flash memory device.

In some embodiments, the plurality of old addresses stored in the mapping table identify defective memory cells, defective memory strings, defective memory pages or defective memory blocks in the flash memory device.

In some embodiments, the new address stored in the mapping table identifies a redundant memory cell, a redundant memory string, a redundant memory page, a redundant memory block or a redundant memory plane in the flash memory device.

In some embodiments, the input signal has a first plane index and a second plane index different from the first plane index, wherein the multi-plane read operations are directed simultaneously to a first memory page in a first memory plane with the first plane index and to a second memory page in a second memory plane with the second plane index.

In some embodiments, the flash memory includes a three-dimensional NAND flash memory.

In some embodiments, the three-dimensional NAND flash memory includes a plurality of memory strings vertically extending through a film stack of alternating conductive and dielectric layers, wherein the plurality of memory strings each includes a channel layer disposed on a sidewall of a core filling film; and a memory film disposed on a sidewall of the channel layer.

The present disclosure also provides a flash memory device having M memory planes, wherein M is an integer greater than 1. The flash memory device also includes a control circuit coupling to the M memory planes by a word line driver and/or a bit line driver. The control circuit comprises M asynchronized multi-plane with independent page address (AMPI) read units, each configured to provide an AMPI read control signal for a respective memory plane of the M memory planes to control an AMPI read operation on the respective memory plane. The control circuit also includes a content addressable memory (CAM), comprising a set of CAM registers shared by the MAMPI read units for repairing firmware of the AMPI read operations.

In some embodiments, the MAMPI read units are microcontroller units (MCUs).

In some embodiments, each of the M memory planes comprises a plurality of memory strings vertically extending through a film stack of alternating conductive and dielectric layers. The plurality of memory strings each comprises a channel layer disposed on a sidewall of a core filling film; and a memory film disposed on a sidewall of the channel layer.

In some embodiments, the CAM further comprises M comparators. Each comparator couples to the set of CAM registers and is configured to compare a plurality of old addresses stored in the set of CAM registers with the AMPI read control signal for the respective memory plane.

In some embodiments, the plurality of old addresses identify defective memory cells, defective memory strings, defective memory pages, or defective memory blocks in the flash memory device.

In some embodiments, the CAM further comprises M multiplexers. Each multiplexer couples to a respective comparator and to the set of CAM registers. Each multiplexer is configured to generate an output signal for the AMPI read operation on the respective memory plane.

In some embodiments, the output signal includes a new address provided by the set of CAM register identifying a redundant memory cell, a redundant memory string, a redundant memory page, or a redundant memory block in the flash memory device.

In some embodiments, each comparator is further configured to generate an output enablement signal indicating a matching status when an input address in the AMPI read control signal matches one of the plurality of old addresses; and send the output enablement signal to a respective multiplexer to generate the output signal for the AMPI read operation on the respective memory plane.

The present disclosure further provides a memory storage system having a flash memory device. The flash memory device includes M memory planes, wherein M is an integer greater than 1. The flash memory device also includes a control circuit coupling to the M memory planes by a word line driver and/or a bit line driver. The control circuit includes M asynchronized multi-plane with independent page address (AMPI) read units, each configured to provide an AMPI read control signal for a respective memory plane of the M memory planes to control an AMPI read operation on the respective memory plane. The control circuit also includes a content addressable memory (CAM) having a set of CAM registers shared by the MAMPI read units for repairing firmware of the AMPI read operations.

The present disclosure further provides a method of repairing firmware for multi-plane read operations in a flash memory device. The method includes the following steps: receiving, at a content addressable memory (CAM), N input signals to perform the multi-plane read operations on N memory planes, wherein N is an integer greater than 1; comparing, by N comparators in the CAM, the N input signals with a first old address stored in a set of CAM registers in the CAM; generating, by the N comparators in the CAM, N output enablement signals to indicate whether a respective input signal comprises an input address matching the first old address; and generating, by N multiplexers in the CAM, N output signals according to the N output enablement signals, wherein at least one of the N output signals directs to a new address stored in the set of CAM registers, wherein the new address corresponds to the first old address.

In some embodiments, the method further includes determining, by a respective comparator, whether the input address of the respective input signal matches the first old address.

In some embodiments, the method further includes generating a respective output enablement signal to indicate a matching status when the input address matches the first old address.

In some embodiments, the generating the N output signals comprises generating a respective output signal having the new address when the respective output enablement signal indicates the matching status.

In some embodiments, the method further includes comparing, by the respective comparator, the input address of the respective input signal with a second old address stored in the set of CAM registers when the input address does not match the first old address, wherein the second old address is different from the first old address.

In some embodiments, the method further includes generating a respective output enablement signal to indicate NULL when the input address does not match any old address stored in the set of CAM registers.

In some embodiments, the generating the N output signals comprises generating a respective output signal having the input address unchanged when the respective output enablement signal indicates NULL.

In some embodiments, the method further includes receiving an input enablement signal to activate the CAM.

In some embodiments, the method further includes storing the first old address in the set of CAM registers to identify a defective memory cell, a defective memory page or a defective memory block in the flash memory device.

In some embodiments, the method also includes storing the new address in the set of CAM registers to identify a redundant memory cell, a redundant memory page or a redundant memory block in the flash memory device.

In some embodiments, the method further includes repairing the firmware for the multi-plane read operations in a three-dimensional NAND flash memory. The three-dimensional NAND flash memory includes a plurality of memory strings vertically extending through a film stack of alternating conductive and dielectric layers. The plurality of memory strings each includes a channel layer disposed on a sidewall of a core filling film; and a memory film disposed on a sidewall of the channel layer Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
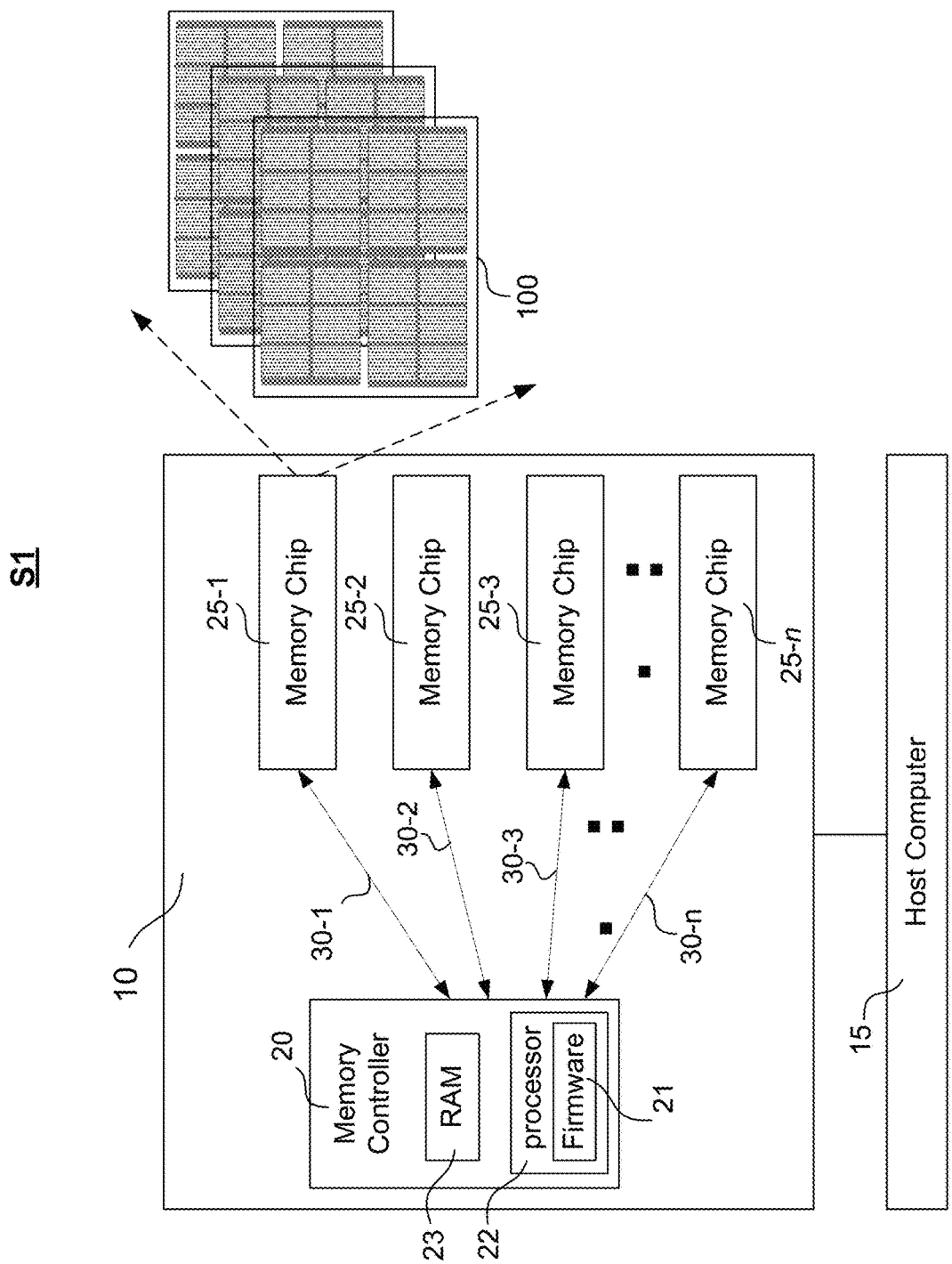
FIGS. 1 and 2A-2B illustrate a storage system with one or more memory chips, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a block diagram of an exemplary system Si having a storage system 10, according to some embodiments of the present disclosure. System Si can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (i.e., "flash," "NAND flash" or "NAND"). The storage system 10 can communicate with a host computer 15 through the memory controller 20, where the memory controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the memory controller 20 via a memory channel 30.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10.

The memory controller 20 can handle I/O requests received from the host computer 15, ensure data integrity and efficient storage, and manage the memory chip 25. To perform these tasks, the controller runs firmware 21, which can be executed by one or more processors 22 (e.g., microcontroller units) inside the controller 20. For example, the controller 20 runs firmware 21 to map logical addresses (i.e., address utilized by the host associated with host data) to physical addresses in the memory chip 25 (i.e., actual locations where the data is stored). The controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21.

The memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 1 can include one or more memory dies 100, where each memory die can be a 3D NAND memory.

Figure 2A:
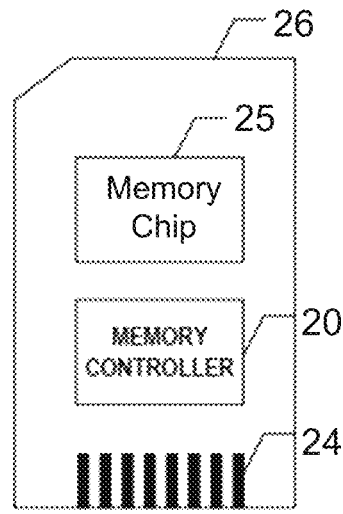
Figure 2B:
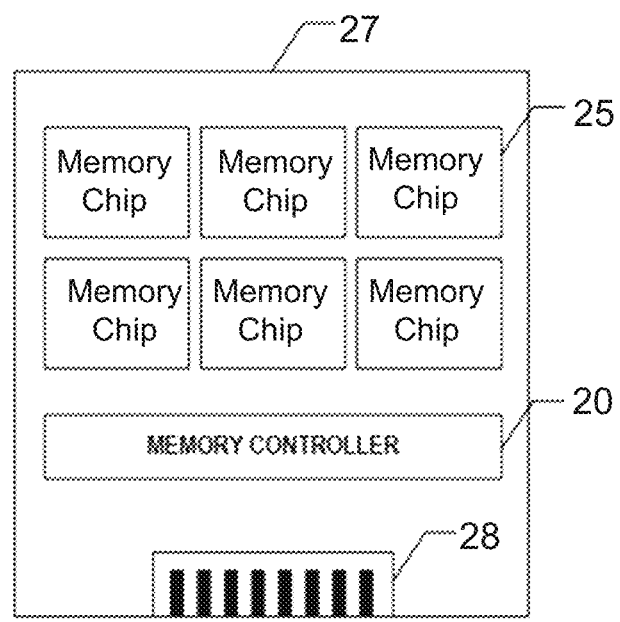

Memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 1). In another example as shown in FIG. 2B, memory controller 20 and multiple memory chip 25 can be integrated into an solid state drive (SSD) 27. SSD 27 can further include an SSD connector 28 coupling SSD 27 with a host (e.g., the host computer 15 in FIG. 1).

Figure 3:
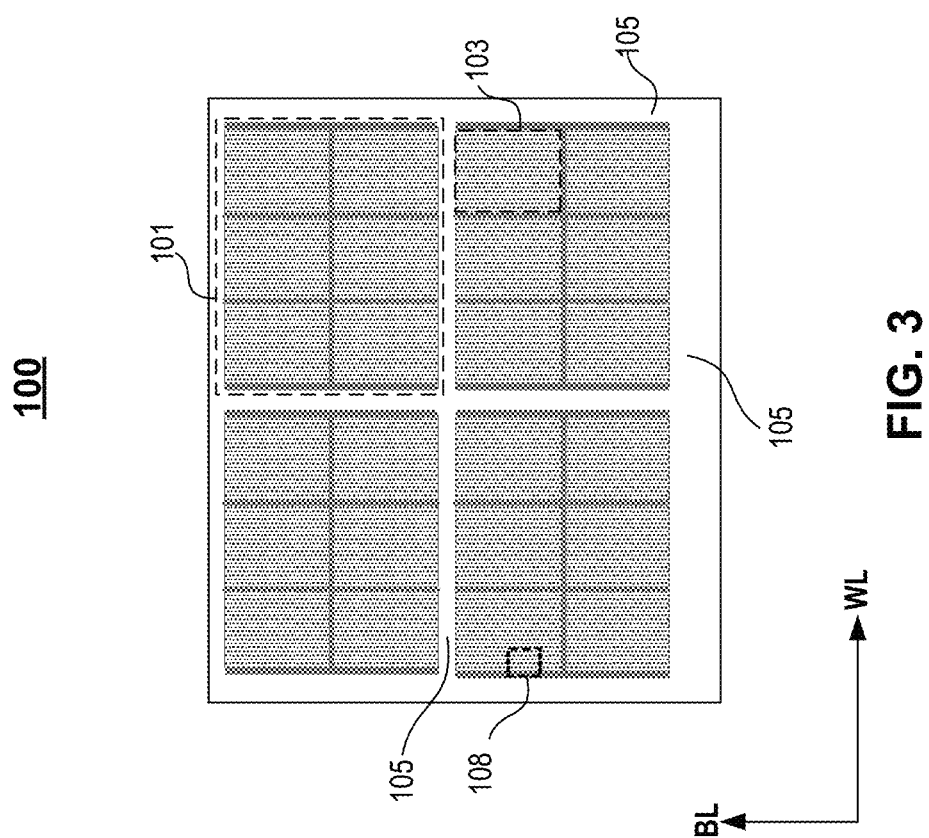
FIG. 3 illustrates a schematic diagram of a memory die, according to some embodiments of the present disclosure.

FIG. 3 illustrates a top-down view of an exemplary memory die 100, according to some embodiments of the present disclosure. The memory die 100 can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 3, the exemplary memory die 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3. In this disclosure, memory block 103 is also referred to as a "memory array" or "array." The memory array is the core area in a memory device, performing storage functions.

The memory die 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the memory die 100 and the arrangement of the memory blocks 103 in each memory plane 101 illustrated in FIG. 3 are only used as an example, which does not limit the scope of the present disclosure.

Figure 4:
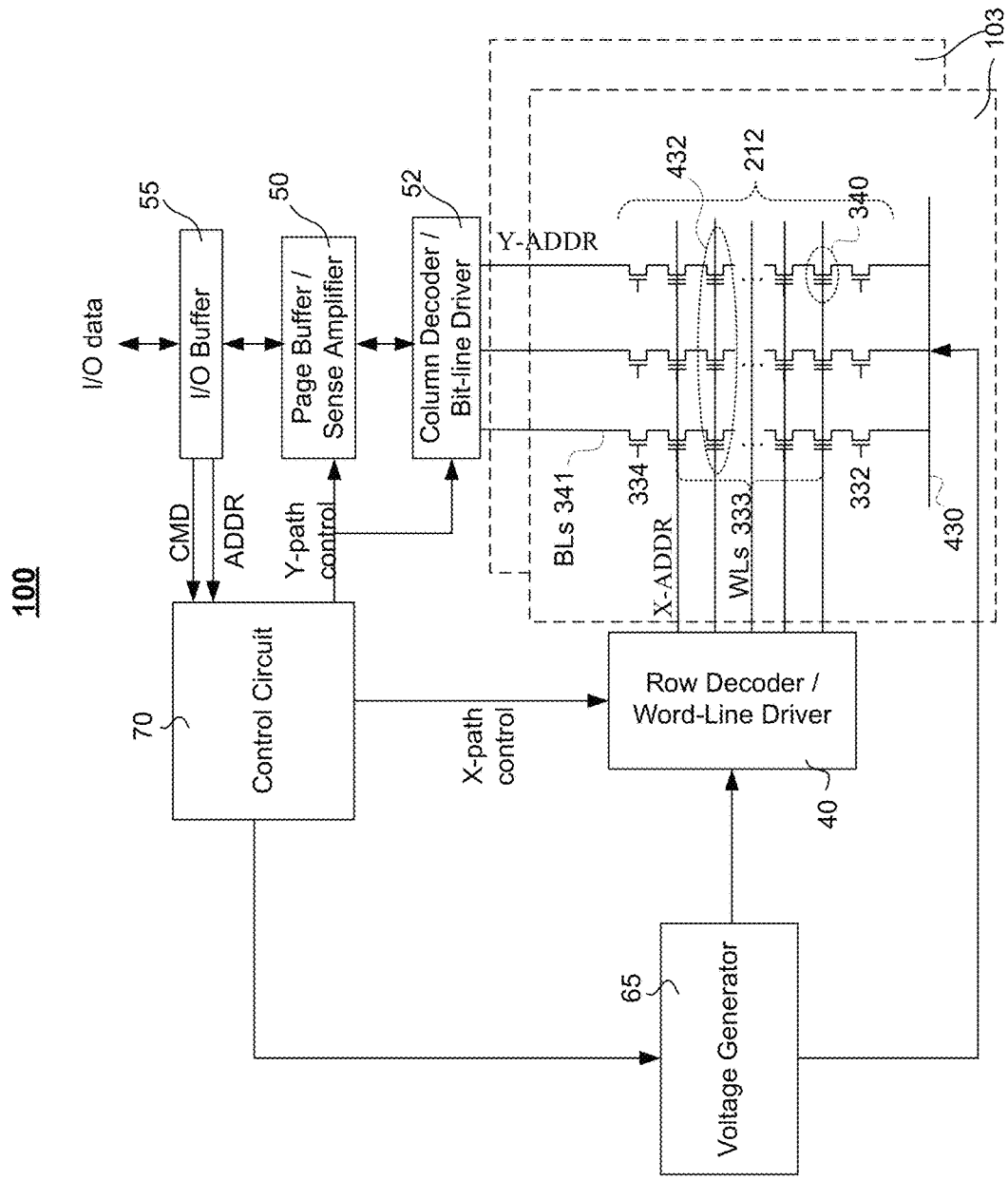
FIG. 4 illustrates a schematic of a three-dimensional (3D) memory die, according to some embodiments of the present disclosure.

FIG. 4 illustrates a schematic diagram of the memory die 100, according to some embodiments of the present disclosure. The memory die 100 includes one or more memory blocks 103 (e.g., 103-1, 103-2, 103-3). Each memory block 103 includes a plurality of memory strings 212. Each memory string 212 includes a plurality of memory cells 340. The memory cells 340 sharing the same word line forms a memory page 432. The memory string 212 also includes at least one field effect transistor (e.g., MOSFET) at each end, which is controlled by a lower select gate (LSG) 332 and a top select gate (TSG) 334, respectively. The drain terminal of the top select transistor 334-T can be connected to the bit line 341, and the source terminal of the lower select transistor 332-T can be connected to an array common source (ACS) 430. The ACS 430 can be shared by the memory strings 212 in an entire memory block, and is also referred to as the common source line.

The memory die 100 also includes a periphery circuit that includes many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word line driver 40 via word lines ("WLs") 333, lower select gates ("LSGs") 332 and top select gates ("TSG") 334. The memory blocks 103 can be coupled with the page buffer/sense amplifier 50 via bit lines ("BLs") 341. The row decoder/word line driver 40 can select one of the memory blocks 103 on the memory die 100 in response to a X-path control signal provided by the control circuit 70. The row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

The column decoder/bit line driver 52 can transfer an inhibit voltage $V_{inhibit}$ to an unselected bit line and connect a selected bit line to ground according to a Y-path control signal received from the control circuit 70. In the other words, the column decoder/bit line driver 52 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 1) and the memory die 100 on the memory chip 25.

The control circuit 70 can control the page buffer/sense amplifier 50 and the row decoder/word line driver 40 in response to the commands CMD transferred by the input/output buffer 55. During the program operation, the control circuit 70 can control the row decoder/word line driver 40 and the page buffer/sense amplifier 50 to program a selected memory cell. During the read operation, the control circuit 70 can control the row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify the memory page 432, memory block 103, and memory plane 101 (in FIG. 3), respectively. The column address Y-ADDR can identify a byte or a word in the data of the memory page 432.

The voltage generator 65 can generate voltages to be supplied to word lines and bit lines under the control of the control circuit 70. The voltages generated by the voltage generator 65 include the read voltage $V_{read}$, the program voltage $V_{pgm}$, the pass voltage $V_{pass}$, the inhibit voltage $V_{inhibit}$, etc.

It is noted that the arrangement of the electronic components in the storage system 10 and the memory die 100 in FIGS. 1, 2A-2B, and 3-4 are shown as examples. The storage system 10 and the memory die 100 can have other layout and can include additional components. For example, the memory die 100 can also have sense amplifier, row and column decoders, etc. Components (e.g., control circuit 70, I/O buffer 55) on the memory die 100 shown in FIG. 4 can also be moved off the memory die 100, as a stand-alone electric component in the storage system 10. Components (e.g., control circuit 70, I/O buffer 55) on the memory die 100 shown in FIG. 4 can also be moved to other components in the storage system 10, for example, a portion of the control circuit 70 can be combined with the memory controller 20 and vice versa.

Figure 5:
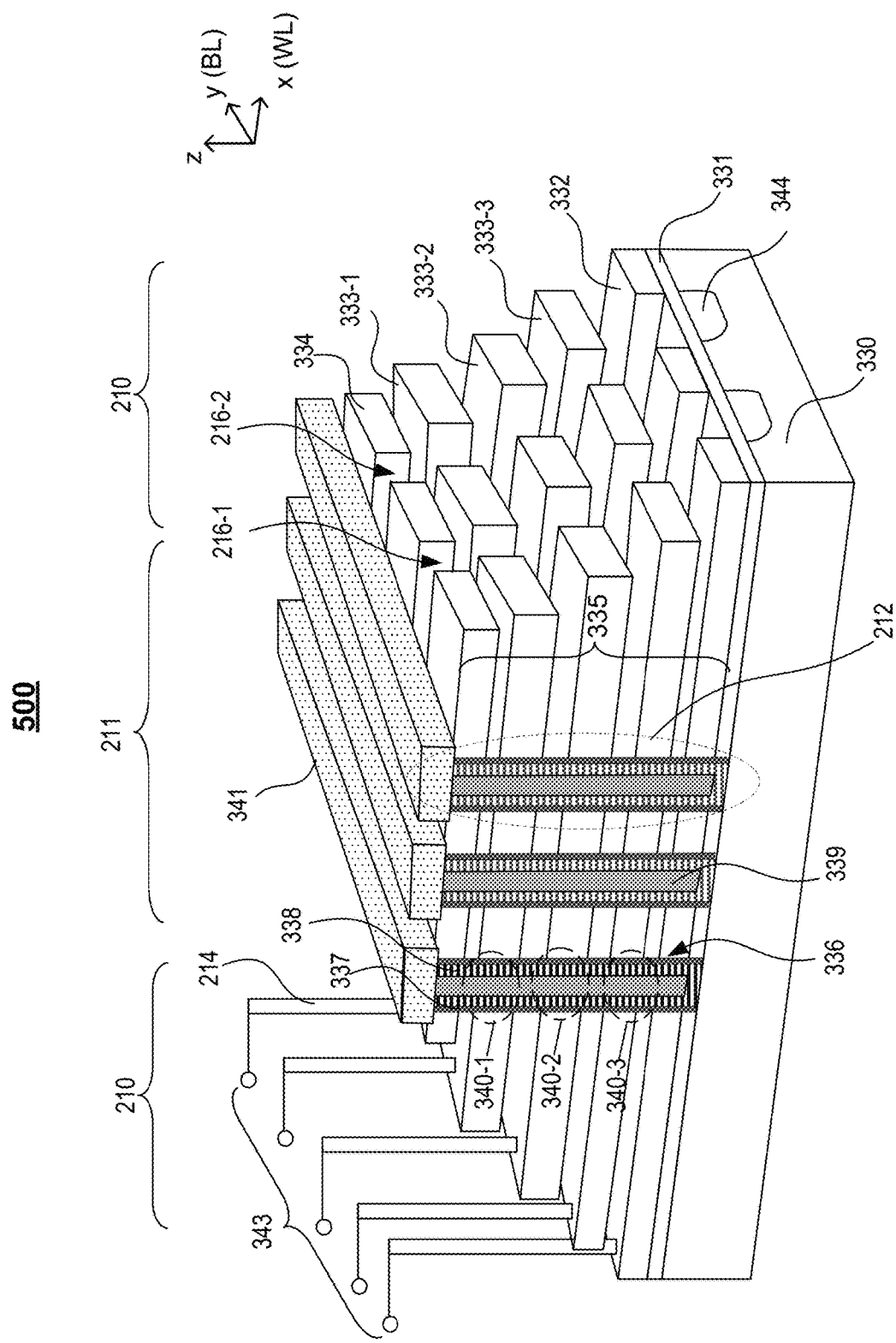
FIG. 5 illustrates a perspective view of a portion of a 3D memory structure, in accordance with some embodiments of the present disclosure.

FIG. 5 illustrates a perspective view of a 3D memory structure 500, according to some embodiments of the present disclosure. In this example, the memory die 100 can be a 3D NAND memory. The 3D memory structure 500 can be a portion of the memory die 100 for example, in a region 108 in FIG. 3. The 3D memory structure 500 can include a staircase region 210 and a channel structure region 211. The channel structure region 211 can include a plurality of memory strings 212, each including a plurality of stacked memory cells 340. The staircase region 210 can include a staircase structure.

The 3D memory structure 500 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 5 for clarity.

The control gates of each tier are separated by slit structures 216-1 and 216-2 through the film stack 335. The 3D memory structure 500 also includes a tier of top select gates (TSGs) 334 over the stack of control gates 333. The stack of TSG 334, control gates 333 and LSG 332 is also referred to as "gate electrodes." The 3D memory structure 500 further includes doped source line regions 344 in portions of substrate 330 between adjacent LSGs 332. Each memory strings 212 of the 3D memory structure 500 includes a channel hole 336 extending through the insulating film 331 and the film stack 335 of alternating conductive and dielectric layers. The memory string 212 also includes a memory film 337 on a sidewall of the channel hole 336, a channel layer 338 over the memory film 337, and a core filling film 339 surrounded by the channel layer 338. The memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel 338 of the memory cell. The 3D memory structure 500 further includes a plurality of bit lines (BLs) 341 connected with the memory strings 212 over the TSGs 334. The 3D memory structure 500 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity.

Referring back to FIG. 4, in some embodiments, the memory block 103 can be formed based on floating gate technology. In some embodiments, the memory block 103 can be formed based on charge trapping technology. The NAND flash memory based on charge trapping can provide high storage density and high intrinsic reliability. Storage data or logic states ("states," e.g., threshold voltages $V_{th}$ of the memory cell 340) depends on the number of charge carriers trapped in the memory film 337 of the memory cell 340.

In a NAND flash memory, a read operation and a write operation (also referred to as program operation) can be performed for the memory page 432, and an erase operation can be performed for the memory block 103.

In a NAND memory, the memory cell 340 can be in an erased state ER or a programmed state P1. Initially, the memory cells 340 in the memory block 103 can be reset to the erased state ER as logic "1" by implementing a negative voltage difference between the control gates 333 and the channel 338 such that trapped charge carriers in the storage layer of the memory cells 340 can be removed. For example, the negative voltage difference can be induced by setting the control gates 333 of the memory cells 340 to ground, and applying a high positive voltage (an erase voltage $V_{erase}$) to the ACS 430. At the erased state ER ("state ER"), the threshold voltage $V_{th}$ of the memory cells 340 can be reset to the lowest value.

During programming (i.e., writing), a positive voltage difference between the control gates 333 and the channel 338 can be established by, for example, applying a program voltage $V_{pgm}$ (e.g., a positive voltage pulse between 10 V and 20 V) on the control gate 333, and grounding the corresponding bit line 341. As a result, charge carriers (e.g., electrons) can be injected into the storage layer of the memory cell 340, thereby increasing the threshold voltage $V_{th}$ of the memory cell 340. Accordingly, the memory cell 340 can be programmed to the programmed state P1 ("state P1").

The state of the memory cell (e.g., state ER or state P1) can be determined by measuring or sensing the threshold voltage $V_{th}$ of the memory cell. During a read operation, a read voltage $V_{read}$ can be applied on the control gate 333 of the memory cell and current flowing through the memory cell can be measured at the bit line 341. A pass voltage $V_{pass}$ can be applied on unselected word lines to switch on unselected memory cells.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states.

While a memory block is the smallest erasable unit in a 3D NAND memory, a memory page is the smallest addressable unit for read and program operations. During the read operation, data from a memory page of a selected memory block can be read according to the page index PD and the block index BD included in the address ADDR received by the control circuit 70. To improve the read throughput, a multi-plane read operation can be implemented by reading the memory pages in multiple memory planes at the same time. Traditionally, multi-plane read operation cannot be performed for memory pages with different page addresses (e.g., different word lines at different tiers, different page indexes PD, etc.). However, in a 3D NAND memory, multi-plane read operations for memory pages with different page address can also be implemented. The multi-plane read operations can be synchronized or asynchronized. While read operations for different memory planes can be started simultaneous during the synchronized multi-plane read operations, the asynchronized multi-plane read operation start read operations at different times.

Figure 6:
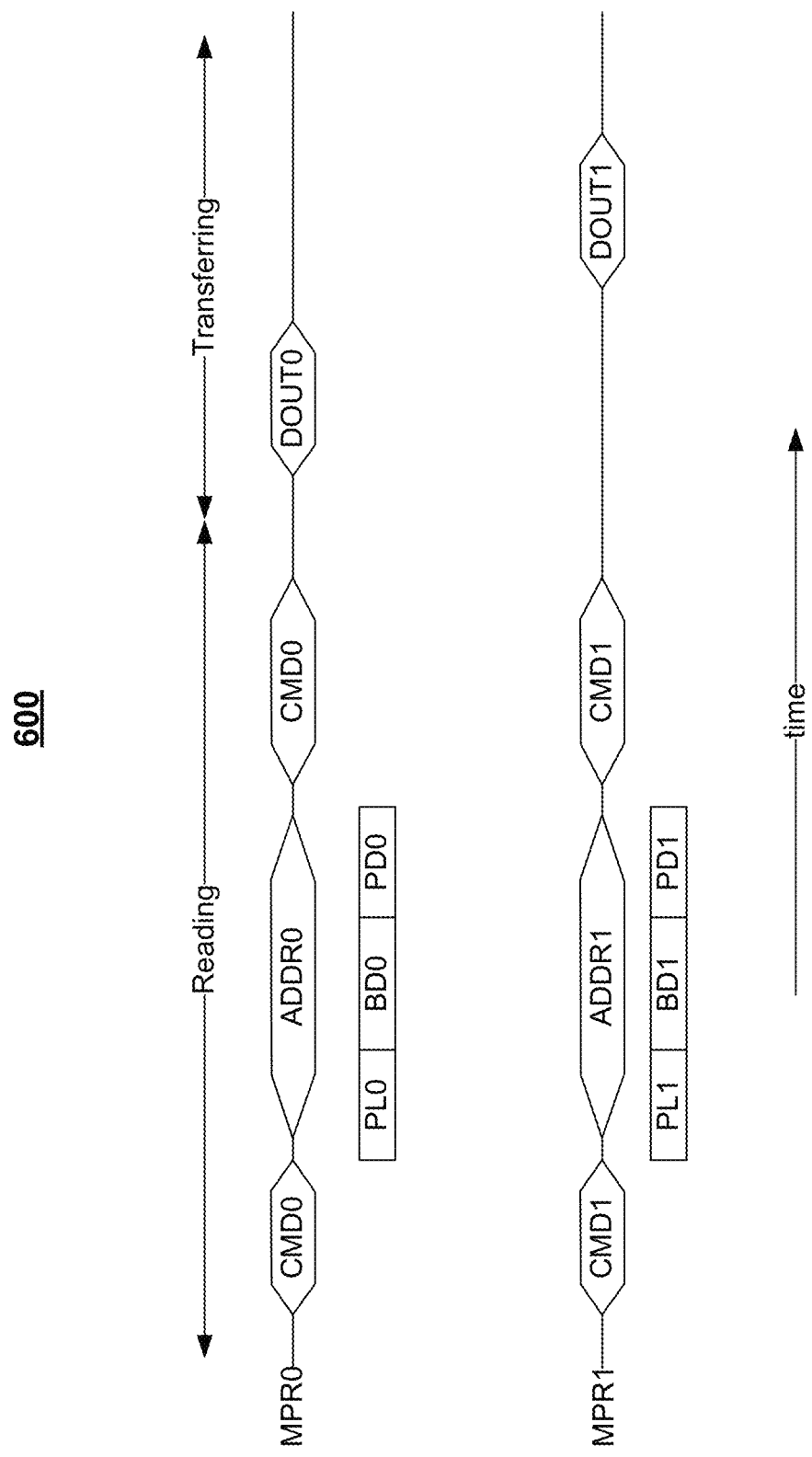
FIG. 6 illustrates a timing diagram of a multi-plane read operation, according to some embodiments of the present disclosure.

FIG. 6 illustrates a timing diagram of a multi-plane read operation 600, according to some embodiments of the present disclosure. In this example, the multi-plane read operation 600 can be performed synchronized in a 3D NAND memory, where multi-plane read operation MPR0 (for memory plane with plane index PL0) and multi-plane read operation MPR1 (for memory plane with plane index PL1 different from plane index PL0) start simultaneously. The multi-plane read operation MPR0 manages commands CMD0, address ADDR0 and data DOUT0, where address ADDR0 includes plane index PL0, block index BD0 and page index PD0. The multi-plane read operation MPR1 manages commands CMD1, address ADDR1 and data DOUT1, where address ADDR1 includes plane index PL1, block index BD1 and page index PD1.

The multi-plane read operation 600 can include a reading step and a transferring step, where the reading step of the multi-plane read operations MPR0 and MPR1 can be performed in parallel. During the transferring step, data from the memory pages PD0 and PD1 can be send to the page buffer/sense amplifier 50 and further to the I/O buffer 55.

In some embodiments, the reading step and the transferring step can also be performed in parallel to reduce latency of the multi-plane read operation. In this example, additional cache can be used to temporarily store data DOUT0/DOUT1, commands CMD0/CMD1 or addresses ADDR0/ADDR1 during parallel operations. In some embodiments, a multi-plane read operation can be implemented to transfer the data for a system request, not an entire memory page, thereby to further reduce the latency of the multi-plane read operation.

Figure 7:
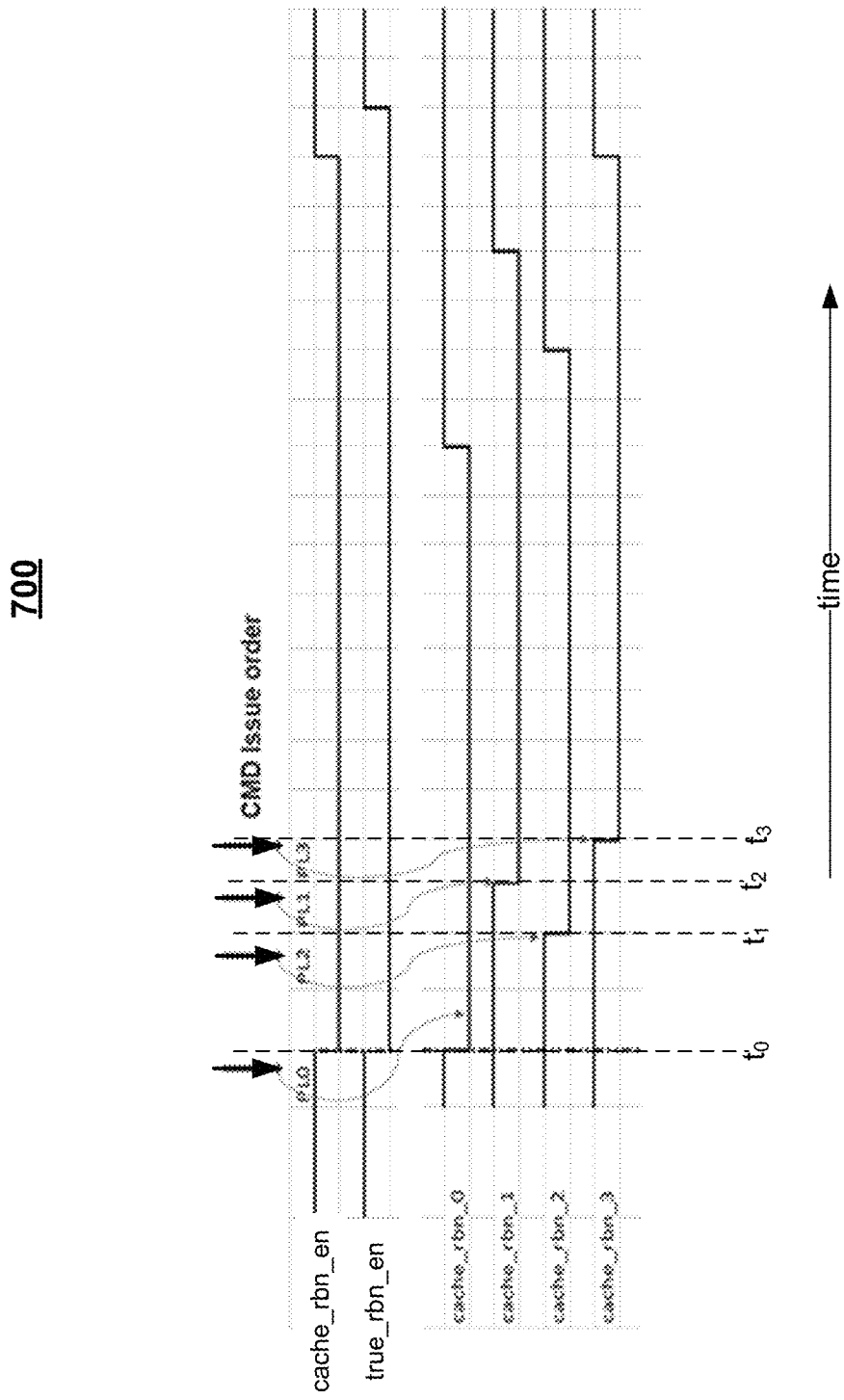
FIG. 7 illustrates a scheme for a read operation with asynchronized multi-plane with independent page address (AMPI), according to some embodiments of the present disclosure.

FIG. 7 illustrates a scheme 700 for read operations of asynchronized multi-plane with independent page address (AMPI), according to some embodiments of the present disclosure. In this example, the command CMD received at the control circuit 70 (as shown in FIG. 4) includes control signals cache_rbn_en, true_rbn_en, cache_rbn_0, cache_rbn_1, cache_rbn_2, and cache_rbn_3 to facilitate AMPI read operations. After enabling signals cache_rbn_en and true_rbn_en are triggered to start the AMPI read operations, enabling signals cache_rbn_0, cache_rbn_1, cache_rbn_2, and cache_rbn_3 for memory planes with the plane indexes PL0, PL1, PL2 and PL3 can be sequentially set to an enabling level at time $t_0$, $t_2$, $t_1$ and $t_3$, respectively. In some embodiments, the enabling level can be a falling edge used to trigger the read operation. As a result, each memory plane can start read operations independently.

Structurally, top select gates 334 of different memory planes can be electrically separated, e.g., through TSG cut or separate staircase structures, to allow the independent operations of memory planes. By implementing the AMPI read operation, random access of memory page can be achieved. Random read operations can thereby be performed in a 3D NAND memory.

Due to process variation, not every memory cell can be programmed to a target state or stay at the target state. A defective memory cell, a defective memory string, a defective memory page, or a defective memory block can be replaced by a redundant memory cell, a redundant memory string, a redundant memory page, or a redundant memory block. In some embodiments, a random access memory (RAM), for example, dynamic random access memory (DRAM) or static random access memory (SRAM), can be used to store a mapping table, which maps an old address $ADDR_{old}$ of the defective memory cell, the defective memory string, the defective memory page, or the defective memory block to a new address $ADDR_{new}$ of the redundant memory cell, the redundant memory string, the redundant memory page or the redundant memory block. However, hardware and firmware designs for the RAM are complicated and usually occupies larger area. In one example, a content addressable memory (CAM) can be used to store the mapping table. The CAM comprises a set of registers (also referred to as "a set of CAM registers"). For example, if a word line or a bit line in the memory block 103 is found to fail, its address can be programmed into the CAM. After that, each time the "failing" word line or bit line is addressed, the CAM can provide an address of a replacement word line or bit line.

Figure 8A:
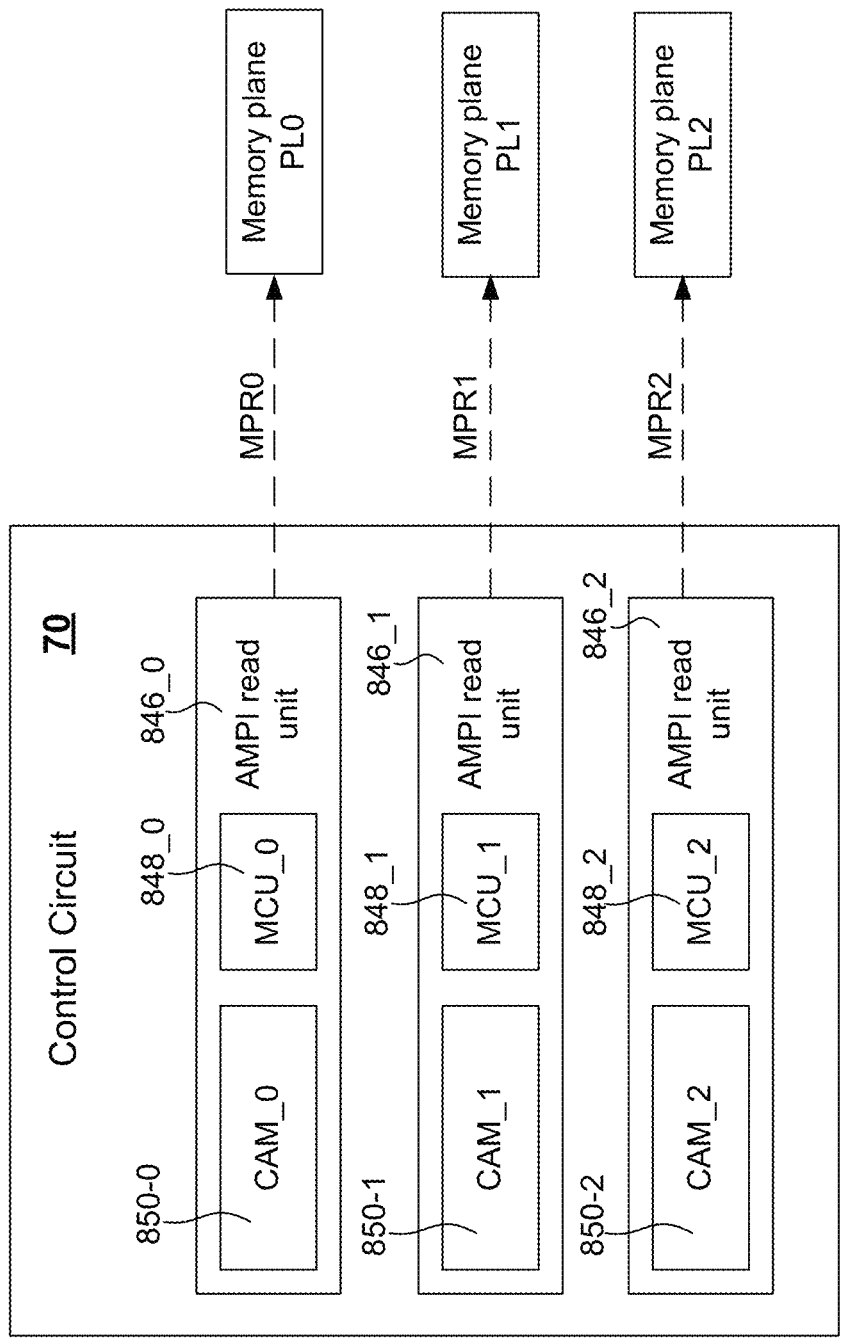
FIG. 8A illustrates a schematic diagram of a control circuit for a 3D NAND memory, according to some embodiments of the present disclosure.

FIG. 8A illustrates an exemplary control circuit 70, according to some embodiments of the present disclosure. In this example, the control circuit 70 includes a plurality of AMPI read unit 846 (e.g., 846_0, 846_1, 846_2, etc.) Each AMPI read unit 846 includes a CAM 850 (e.g., 850_0, 850_1, 850_2, etc.) and a microcontroller unit (MCU) 848 (e.g., 848_0, 848_1, 848_2, etc.). Each AMPI read unit 846 is responsible for controlling the AMPI read operation (e.g., MPR0, MPR1, MPR2) of a respective memory plane (e.g., with plane index PL0, PL1, PL2). Namely, if there are N number of memory planes (N≥2), the control circuit 70 can implement N number of AMPI read units 846. Accordingly, the control circuit 70 can have N number of MCUs and N number of CAMs.

In some embodiments, each MCU 848 can include one or more processing cores (e.g., arithmetic-logic units), control logics, addressing logics, instruction logics that can execute firmware and/or software codes. Each MCU 848 can also include one or more memories (e.g., DRAM, SRAM, Flash, registers, etc.) It is understood that the MCU 848 can include any suitable types of processors.

In some embodiments, when the AMPI read unit 846 (e.g., 846-0) is performing the AMPI read operation (e.g., MPR0) for the memory plane (e.g., PL0), the MCU 848 (e.g., 848_0) can execute the firmware and/or software codes and communicate with the CAM 850 (e.g., 850_0) to repair the firmware and/or software codes when necessary.

Figure 8B:
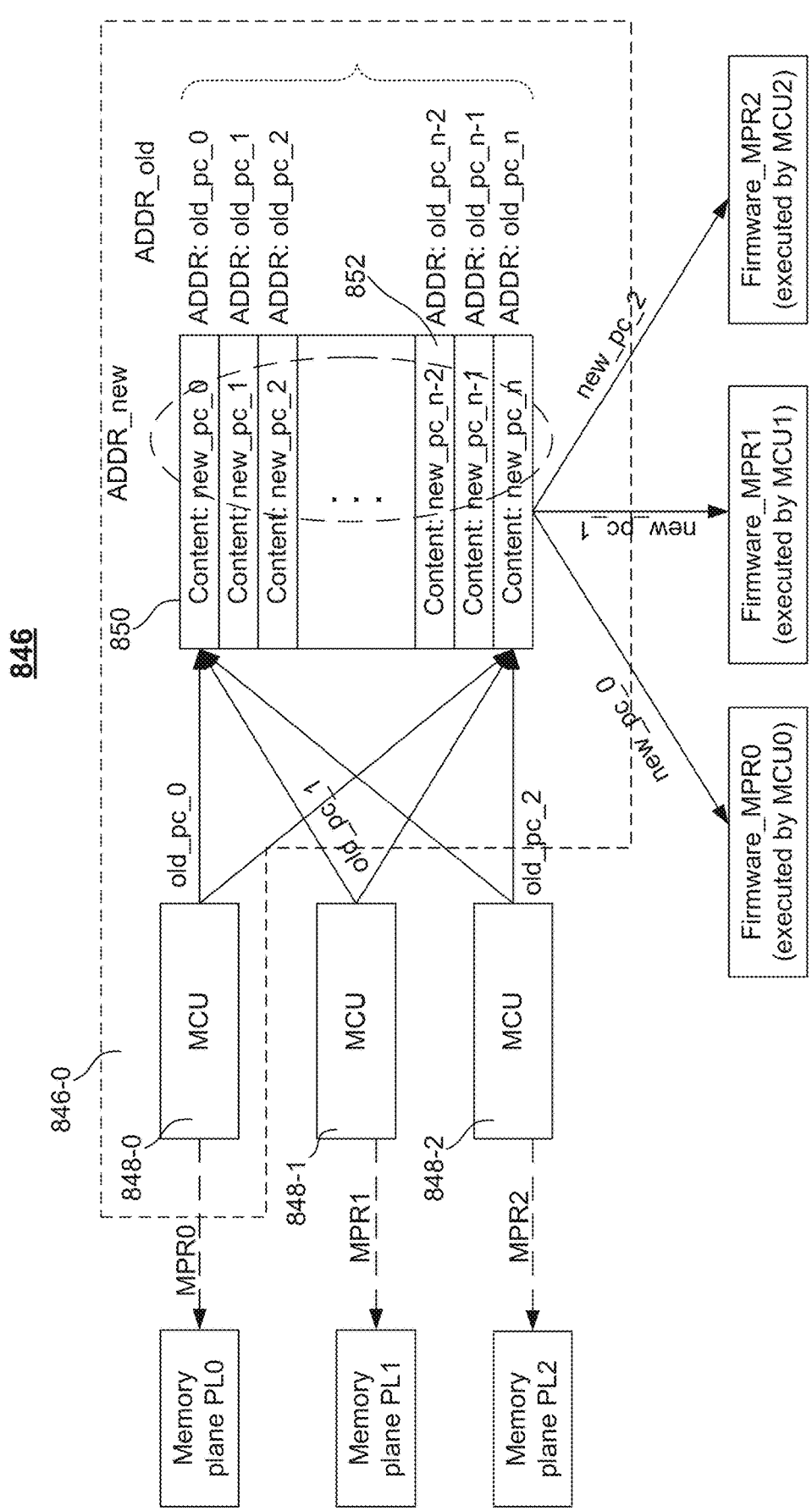
FIG. 8B illustrates a schematic diagram of AMPI read units, according to some embodiments of the present disclosure.

FIG. 8B illustrates another embodiment of the AMPI read units 846 designed for performing multi-plane read operations in a 3D NAND memory, according to some embodiments of the present disclosure. In this example, a plurality of AMPI read units 846 share the same CAM 850. For example, the MCU 848-0 of the AMPI read unit 846-0 can be coupled with the CAM 850 to perform the multi-plane read operation (e.g., AMPI read operation) MPR0 for the memory plane PL0. Similarly, the MCU 848-1 of the AMPI read unit 846-1 (not shown) is also coupled with the CAM 850 to perform the multi-plane read operation (e.g., AMPI read operation) MPR1 for the memory plane PL1. And the MCU 848-2 of the AMPI read unit 846-2 (not shown) is also coupled with the CAM 850 to perform the multi-plane read operation (e.g., AMPI read operation) MPR2 for the memory plane PL2.

In a 3D NAND memory, storage density has been significantly increased. However, due to structural and design complexity, various process variations can result in defective memory cells, defective memory strings, defective memory pages or defective memory blocks. The CAM 850 can be used to store addresses of the defective memory cells/strings/pages/blocks and store addresses of corresponding redundant memory cells/strings/pages/blocks as replacement. However, with increased error bits, the CAM 850 can have a large size and occupy large area. Therefore, sharing the same CAM for the AMPI read units 846 can greatly save area and lower cost.

As shown in FIG. 8B, the CAM 850 includes a set of CAM registers 852, which stores a mapping table with a first set of old addresses and a second set of new addresses. Each old address corresponds to a new address. The CAM 850 can retrieve a new address ADDR_new based on an old address ADDR_old according to the mapping table stored in the CAM 850. When the CAM 850 is activated by one of the MCUs 848, the mapping table is searched according to an input signal (AMPI read control signal). If the input signal matches one of the old addresses ADDR_old, a corresponding address (e.g., the new address ADDR_new) can be returned. If the input signal does not match any one of old addresses ADDR_old in the mapping table, the CAM 850 returns a logic NULL.

For example, when performing multi-plane read operations MPR0, MPR1 and MPR2, corresponding MCUs can compare input addresses in the input signals with old addresses pointed by a first set of program counters old_pc_0, old_pc_1 and old_pc_2. In some embodiments, the input addresses in the input signals include previously known addresses of the memory cells/strings/pages/blocks/planes that are to be read. When the CAM 850 receives the input signals from the associated MCUs, the mapping table is searched and the input addresses are compared with the old addresses pointed by the program counters old_pc_0, old_pc_1 and old_pc_2. In some embodiments, the first set of program counters old_pc_0, old_pc_1 and old_pc_2 can temporally store the old addresses.

If matching old addresses ADDR_old are found in the mapping table, it is indicated that the memory cells/strings/pages/blocks located at the previously known addresses are defective and should be replaced with the redundant memory cells/strings/pages/blocks located at the new addresses ADDR_new. In some embodiments, a second set of program counters new_pc_0, new_pc_1 and new_pc_2 can be used to direct to the new addresses ADDR_new. In some embodiments, a second set of program counters new_pc_0, new_pc_1 and new_pc_2 can temporally store the new addresses ADDR_new.

By updating the program counters, firmware related to the multi-plane read operations MPR0, MPR1 and MPR2 can be updated accordingly. The MCU 848 in each AMPI read unit 846 can then execute the updated firmware for respective multi-plane read operations. As such, firmware of a 3D NAND memory can be repaired for multi-plane read operations to avoid defective memory cells/strings/pages/blocks. When the AMPI read units 846 execute the multi-plane read operations, the repaired firmware can direct to the redundant memory cells/strings/pages/blocks located at the new addresses ADDR_new.

In this example, each MCU 848 can include the firmware and software. In some embodiments, each MCU 848 can also fetch and execute firmware and software installed in another memory element associated with the respective MCU 848.

As described above, the AMPI read units 846 in FIG. 8B share the CAM 850. For example, to perform AMPI read operations for M number of memory planes (M≥2), M number of AMPI read units can be implemented, where each AMPI read unit includes a MCU. However, the M number of AMPI read units can share one CAM. As a result, area of the control circuit 70 can be scaled to smaller dimensions. Additionally, because a fixed firmware can be used to repair failing bits (defective memory cells/strings/pages/blocks) during multiple read operations, the performance of the 3D NAND memory can be more efficient.

In some embodiments, the control circuit 70 can also include a main MCU (not shown in FIGS. 8A-8B). The main MCU can control operations of the AMPI read units 846 and facilitate read or program operations other than AMPI read operations.

Figure 9:
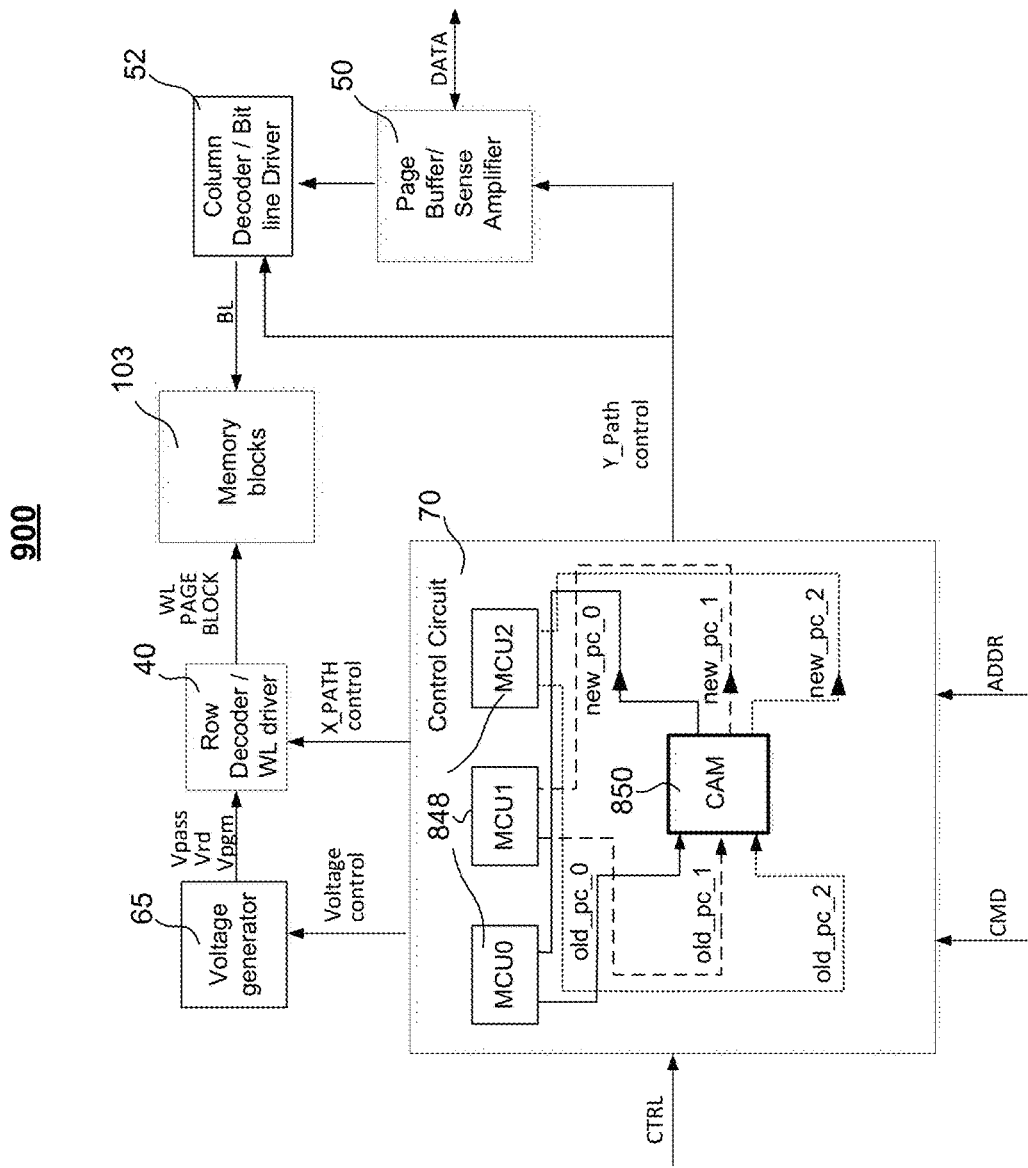
FIGS. 9 and 10 illustrate content addressable memories for multi-plane read operations, according to some embodiments of the present disclosure.

FIG. 9 illustrates a schematic diagram of a 3D NAND memory 900, according to some embodiments of the present disclosure. Similar to the memory die 100 discussed previously with respect to FIGS. 1, 3 and 4, the 3D NAND memory 900 also includes one or more memory blocks 103, the page buffer/sense amplifier 50, the row decoder/word line driver 40, the column decoder/bit line driver 52, the voltage generator 65 and the control circuit 70.

In this example, the control circuit 70 includes a plurality of MCUs 848 that share the CAM 850, similar to the AMPI read units 846 described with respect to FIG. 8B. The firmware executed by the MCUs 848 can include a first set of program counters old_pc_0, old_pc_1 and old_pc_2, respectively, which can be used to contain previously known addresses of memory cells/strings/pages/blocks where the multi-plane read operations are to be performed. When the mapping table stored in the CAM 850 is searched by a particular MCU 848 (e.g., MCU0) and if it is determined that the address stored in the first program counters (e.g., old_pc_0) matches an old address stored in the CAM 850, the CAM 850 can return a corresponding new address, which can be directed by or stored into a second set of program counters (e.g., new_pc_0, new_pc_1 and new_pc_2). When the respective MCU 848 (e.g., MCU0) executes the associated firmware for the multi-plane read operations (e.g., AMPI read operation MPR0), the addresses in the firmware can be updated and repaired accordingly. As a result, defective memory cells/strings/pages/blocks at the old addresses can be replaced by the redundant memory cells/strings/pages/blocks at the new addresses based on the mapping table of the CAM 850.

In some embodiments, the second set of program counters new_pc0, new_pc1 and new_pc2 can then be used in the subsequent firmware and hardware for the multi-plane read operations, e.g., to generate the X-path control signals and the Y-path control signals for the row decoder/WL driver 40, column decoder/BL driver 52, and the page buffer/sense amplifier 50, respectively. As such, CAM 850 can be used to facilitate multi-plane read operations with repaired (or new) addresses. It is noted that the old and new addresses stored in the first and second sets of program counters can include page indexes PD, block indexes BD and plane indexes PL, where the plane indexes PL can be different for read operations on different memory planes.

Figure 10:
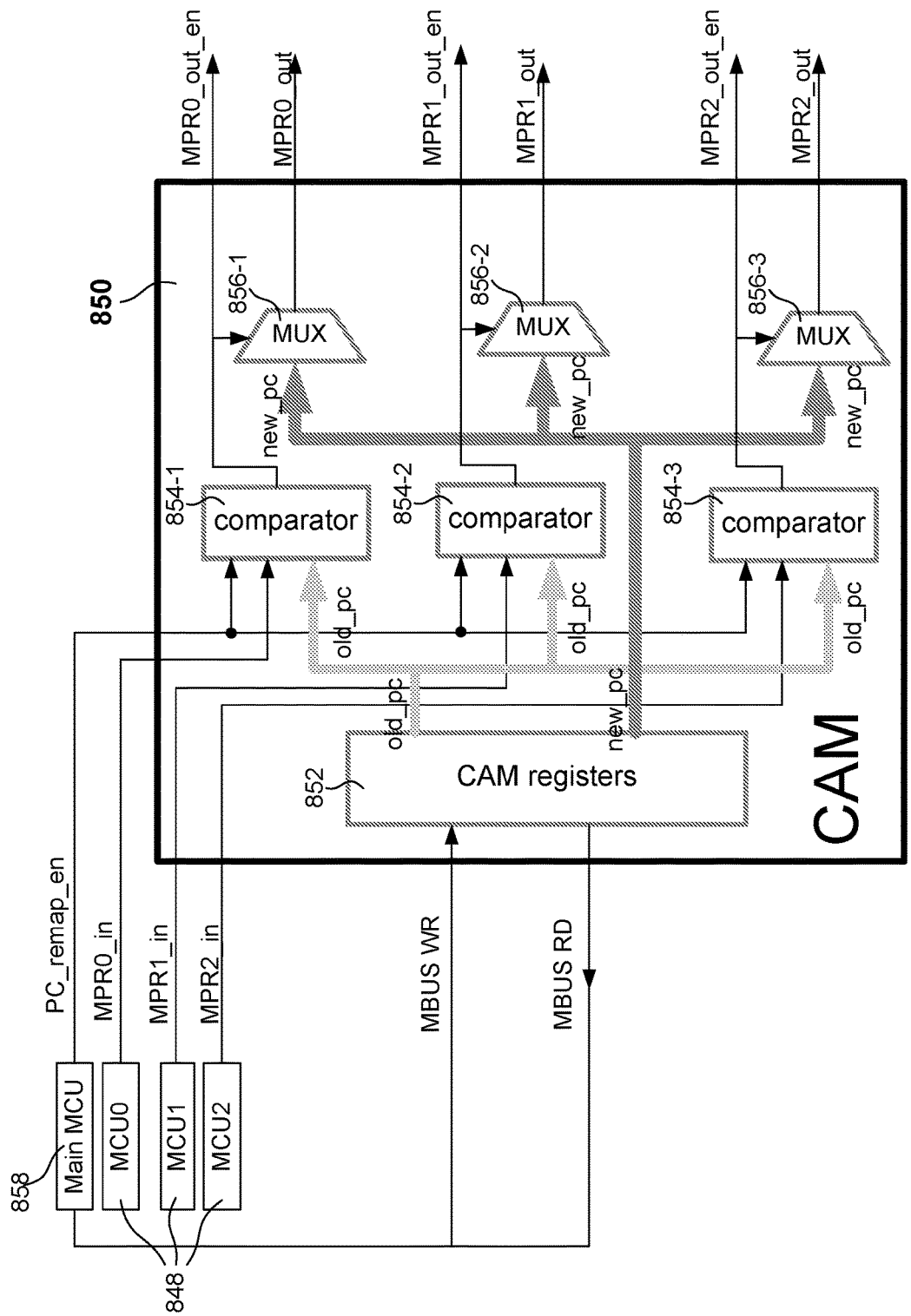

FIG. 10 illustrates another embodiment of CAM 850 used for the multi-plane read operations (e.g., AMPI read operations) of a 3D NAND memory. In this example, CAM 850 includes a plurality of CAM registers 852, a plurality of comparators 854 (e.g., 854-1, 854-2, 854-3), and a plurality of multiplexers (MUX) 856 (e.g., 856-1, 856-2, 856-3). Here, the plurality of CAM registers 852 can be used to store the mapping table similar to the mapping table shown in FIG. 8B. In this example, input signals (e.g., AMPI read control signal) MPR0_in, MPR1_in and MPR2_in received by CAM 850 can be generated by the MCUs 848 for performing multi-plane read operations MPR0, MPR1 and MPR2 for memory planes with plane indexes PL0, PL1 and PL2. Additionally, an input enablement signal PC_remap_en can be generated by a main MCU 858 inside the control circuit 70, wherein the input enablement signal PC_remap_en can be used to activate CAM 850. In some embodiments, the multi-plane read operations can be the AMPI read operations described previously and the MCUs 848 can be similar to MCUs 848 of the AMPI read units in the control circuit 70 described with respect with FIGS. 8A-8B and 9. As described before, each AMPI read unit includes one MCU 848 associated with the CAM 850, wherein the CAM 850 is shared by the MCUs 848 of other AMPI read units.

As shown in FIG. 10, each of the input signals MPR0_in, MPR1_in and MPR2_in can be compared with a first program counter old_pc at one of the comparators 854. Here, the first program counter old_pc can be used to store one of the old addresses (e.g., old_pc_0) in the mapping table of the plurality of CAM registers 852. If the input signal MPR0_in, MPR1_in or MPR2_in has content matching the old address (e.g., old_pc_0), output enablement signals MPR0_out_en, MPR1_out_en or MPR2_out_en can be generated to ihing status (e.g., "TRUE" or "1") and sent to the MUX 856-1, 856-2 and 856-3, respectively.

If the input signal MPR0_in, MPR1_in or MPR2_in does not match the old address (e.g., old_pc_0), the first program counter old_pc can be directed to the next old address in the mapping table, e.g., old_pc_1, which is compared with the input signal MPR0_in, MPR1_in or MPR2_in again at the respective comparator 854-1, 854-2 and 854-3. The above comparing process can be repeated until all the old addresses in the mapping table have been compared with the input signals MPR0_in, MPR2_in or MPR3_in. If the input signal MPR0_in, MPR2_in or MPR3_in does not match any of the old addresses in the mapping table, the output enablement signals MPR0_out_en, MPR1_out_en or MPR2_out_en can be set as "NULL" or "0".

The output enablement signals MPR0 out_en, MPR1_out_en and MPR2_out_en can be multiplexed with a second program counter new_pc containing the new addresses ADDR_new in the mapping table. In one example, the second program counter new_pc corresponds to the first program counter old_pc. For example, when the first program counter points to old_pc_0, the second program counter points to new_pc_0. When the first program counter points to old_pc_1, the second program counter points to new_pc_1, and so on. When the first program counter points to old_pc_n, the second program counter points to new_pc_n. If the output enablement signal MPR0_out_en, MPR1_out_en or MPR2_out_en indicates the matching status (e.g., "TRUE" or "1"), the MUX 856-1, 856-2 or 856-3 can generate an output signal MPR0_out, MPR1 out or MPR2_out containing a new address directed by the second program counter new_pc. As such, the input signals MPR0_in, MPR2_in and MPR3_in with old addresses can be updated to the output signals MPR0_out, MPR1 out and MPR2_out with new addresses. Firmware for multi-plane read operations is thereby repaired.

If the output enablement signals MPR0_out_en, MPR1_out_en and MPR2_out_en indicate that no matching is found for all the old addresses in the mapping table, the output signals MPR0_out, MPR1_out and MPR2_out can be set unchanged from the input signals MPR0_in, MPR1_in and MPR2_in, i.e., the input address is not changed because it does not correspond to a defective memory cell/string/page/block.

In the example of FIG. 10, CAM 850 also includes data buses MBUS WR and MBUS RD for updating the mapping table stored in the plurality of CAM registers 852, e.g., writing new data to the mapping table and reading/verifying the new data, which can be controlled by the main MCU 858.

It is noted that the number of the multi-plane read operations illustrated in FIG. 10 is not so limited. In some embodiments, similar scheme can be used for N number of multi-plane read operations (N≥2) for N number of memory planes. In this example, CAM 850 can include N number of comparators and N number of MUX. However, one set of CAM registers 852 can be used for the N number of multi-plane read operations. By sharing the plurality of CAM registers 852 in repairing firmware for multi-plane read operations, area can be saved, manufacturing cost can be greatly reduced and operations can be more efficient by using the same fixed firmware.

It is also noted that the design and arrangement of the CAM 850 in FIGS. 8-10 are shown as examples only. CAM 850 to repair firmware for multi-plane read operations in a 3D NAND memory can also include other layout and additional components. In some embodiments, CAM 850 can be included in the memory controller 20 (in FIG. 1). In some embodiments, CAM 850 can be moved off memory die 100 and can be designed as a stand-alone electric component in the storage system 10.

Figure 11:
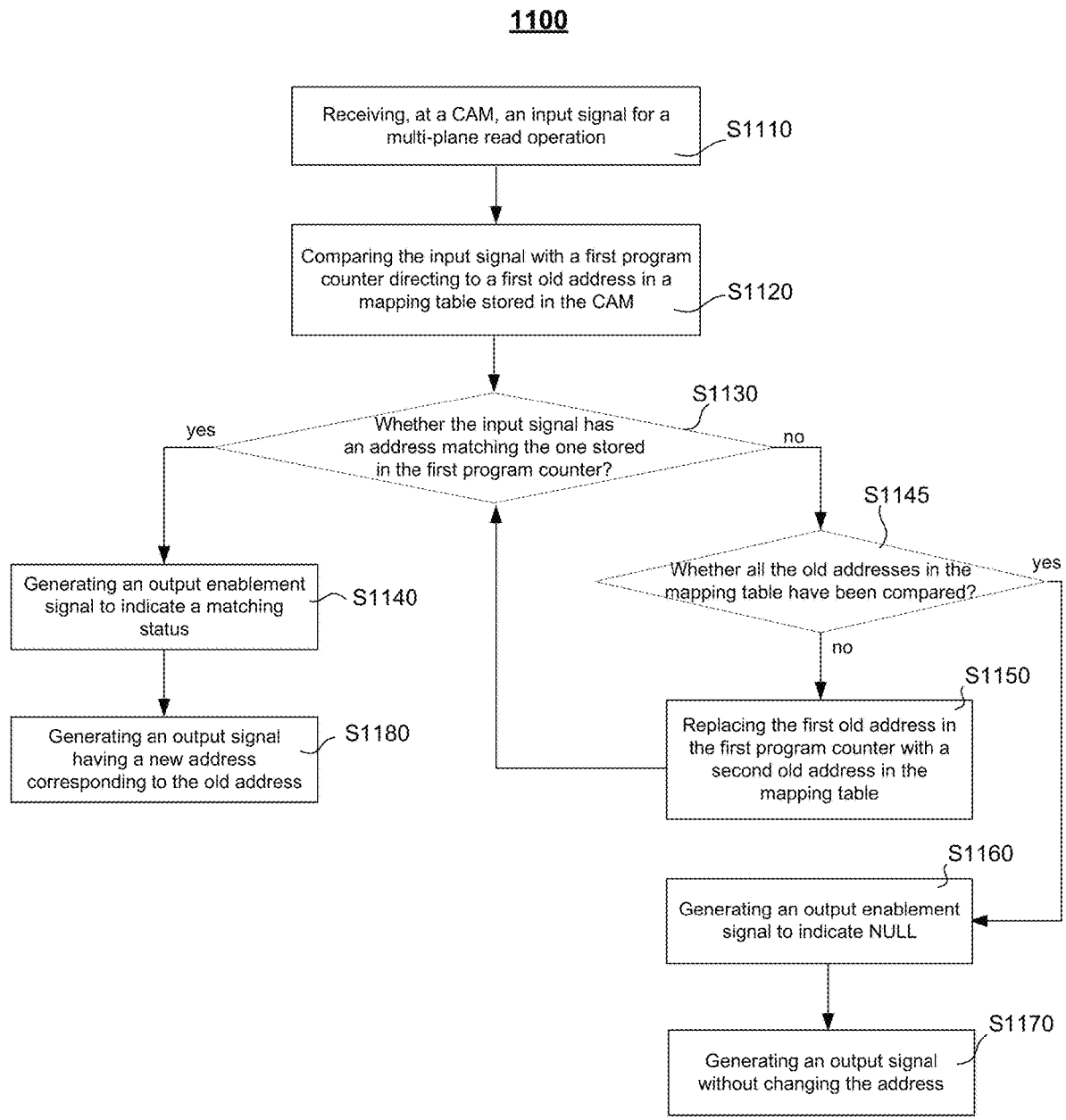
FIG. 11 illustrates a method of firmware repair in a 3D NAND memory, according to some embodiments of the present disclosure.

FIG. 11 illustrates a method 1100 for repairing firmware in a 3D NAND flash memory, according to some embodiments of the present disclosure. It should be understood that the steps shown in method 1100 are not exhaustive and that other steps can be performed as well before, after, or between any of the illustrated steps. In some embodiments, some steps of method 1100 can be omitted or include other steps that are not described here for simplicity. In some embodiments, steps of method 1100 can be performed in a different order and/or vary.

The method 1100 will be described below using the CAM 850 in FIG. 10 as an example. Similar method can be used for other CAM designs.

At step S1110, input signals (e.g., MPR0_in, MPR1_in and MPR2_in) are received at the CAM 850. The input signals MPR0_in, MPR1_in and MPR2_in are associated with multi-plane read operations MPR0, MPR1 and MPR2 for performing read operations at memory pages (with page indexes PD0, PD1 and PD2) located on different memory planes (with plane indexes PL0, PL1 and PL2). Additionally, an input enablement signal PC_remap_en can be used to activate CAM 850.

In some embodiments, the input signals MPR0_in, MPR1_in and MPR2_in include input addresses ADDR0_in, ADDR1_in and ADDR2_in of memory cells, memory strings, memory pages, memory blocks and/or memory planes previously known, where the multi-plane read operations are to be performed. In some embodiments, the input addresses ADDR0_in, ADDR1_in and ADDR2_in associated with the multi-plane read operations MPR0, MPR1 and MPR2 direct to different memory pages on different memory planes in the 3D NAND memory. In some embodiments, each of the input addresses ADDR0_in, ADDR1_in and ADDR2_in can include a row address X-ADDR having the page index PD, block index BD and plane index PL. In some embodiments, each of the input addresses ADDR0_in, ADDR1_in and ADDR2_in can also include a column address Y-ADDR. However, due to process variation, some of the memory cells/strings/pages/blocks/planes can be defective and need to be replaced by a set of predetermined redundant memory cells/strings/pages/blocks/planes located at new addresses. The remaining steps of method 1100 provide a process flow to update the input signals MPR0_in, MPR1_in and MPR2_in accordingly.

At step S1120, the input signals MPR0_in, MPR1_in and MPR2_in are compared with a first program counter old pc at the comparators 854-1, 854-2 and 854-3, respectively. The first program counter old pc directs to a first old address old_pc_0 (also referred to as a first address of a first set of map addresses) in a mapping table stored in the CAM 850. In some embodiments, the mapping table can be stored in the plurality of CAM registers 852 inside the CAM 850. The mapping table contains a plurality of old addresses (also referred to as the first set of map addresses) and a plurality of new addresses (also referred to as a second set of map addresses), where the old addresses (i.e., the first set of map addresses) provide the locations of the defective memory cells/strings/pages/blocks/planes, and the new addresses (i.e., the second set of map addresses) provide the locations of the redundant memory cells/strings/pages/blocks/planes intended to replace the defective ones. In the mapping table, one new address corresponds to one old address. While the old addresses can be stored in the first program counter old_pc, the new addresses can be stored in the second program counter new_pc.

At step S1130, it is determined whether the input signals MPR0_in, MPR1_in and MPR2_in have an address matching the one stored in the first program counter old_pc, e.g., the first old address old_pc_0.

If the input address ADDR0_in of the input signal MPR0_in matches the first old address old_pc_0, an output enablement signal MPR0_out_en can be generated by the comparator 854-1 to indicate a matching status at step S1140. Similarly, if the input address ADDR1_in of the input signal MPR1_in or the input address ADDR2_in of the input signal MPR2_in matches the first old address old_pc_0, an output enablement signal MPR1_out_en or MPR2_out_en can be generated by the comparator 854-2 or 854-3 to indicate the matching status.

If the input address ADDR0_in of the input signal MPR0_in does not match the first old address old_pc_0, the first old address old_pc_0 in the first program counter old_pc can be replaced by a second old address (e.g., old_pc_1) in the mapping table as show in step S1150. The first program counter old_pc can thereby direct to the second old address old_pc_1 (also referred to the second address of the first set of map addresses). And the input signal MPR0_in can be compared again with the first program counter, at step S1130, to determine whether the input address ADDR0_in matches the second old address old_pc_1. Similar process flow can be applied to input signals MPR1_in and MPR2_in.

If all the old addresses (i.e., all of the first set of map addresses) in the mapping table have been compared with the input address ADDR0_in in the input signal MPR0_in and no matching address can be found (see step S1145), the output enablement signal MPR0_out_en can be generated by the comparator 854-1 to indicate NULL at step S1160. Similarly, the output enablement signals MPR1_out_en and MPR2_out_en can be generated by the comparators 854-2 and 854-3 to indicate NULL at step S1160 if no matching address can be found in the mapping table.

At step S1170, an output signal MPR0_out can be generated by the MUX 856-1 without changing the input address ADDR0_in if the output enablement signal MPR0_out_en indicate NULL. In the other words, the multi-plane read operations to be performed at memory cells/strings/pages/blocks/planes located at the input address ADDR0_in are not marked defective by the storage system.

If the output enablement signal MPR0_out_en indicates the matching status, the output signal MPR0_out can be generated with a new address ADDR0 new at step S1180. In the other words, when memory cells/strings/pages/blocks/planes located at the input address ADDR0_in are marked defective by the storage system, they can be replaceable by the redundant memory cells/strings/pages/blocks/planes located at the new address ADDR0 new. The new address ADDR0 new can be determined according to a second program counter new_pc which returns a new address new_pc_0 (also referred to as a first address of the second set of map addresses) in the mapping table corresponding to the old address old_pc_0 (i.e., the first address of the first set of map addresses).

In summary, the present disclosure provides a content addressable memory (CAM) for repairing firmware of multi-plane read operations in a flash memory device. The CAM comprises a set of CAM registers configured to store a mapping table. The mapping table comprises a plurality of old addresses, each old address corresponding to a new address. The CAM also comprises N comparators coupling to the set of CAM registers, and configured to compare the old addresses with N input signals for performing the multi-plane read operations on N memory planes, wherein N is an integer greater than 1. The CAM further comprises N multiplexers coupling to the N comparators respectively and to the set of CAM registers, and configured to generate N output signals for the multi-plane read operations. At least one of the N output signals comprises the new address according to the mapping table and a comparison output by the comparators.

The present disclosure also provides a flash memory device having M memory planes, wherein M is an integer greater than 1. The flash memory device also includes a control circuit coupling to the M memory planes by a word line driver and/or a bit line driver. The control circuit comprises M asynchronized multi-plane with independent page address (AMPI) read units, each configured to provide an AMPI read control signal for a respective memory plane of the M memory planes to control an AMPI read operation on the respective memory plane. The control circuit also includes a content addressable memory (CAM), comprising a set of CAM registers shared by the MAMPI read units for repairing firmware of the AMPI read operations.

The present disclosure further provides a memory storage system having a flash memory device. The flash memory device includes M memory planes, wherein M is an integer greater than 1; and a control circuit coupling to the M memory planes by a word line driver and/or a bit line driver. The control circuit includes M asynchronized multi-plane with independent page address (AMPI) read units, each configured to provide an AMPI read control signal for a respective memory plane of the M memory planes to control an AMPI read operation on the respective memory plane. The control circuit also includes a content addressable memory (CAM) having a set of CAM registers shared by the MAMPI read units for repairing firmware of the AMPI read operations.

The present disclosure further provides a method of repairing firmware for multi-plane read operations in a flash memory device. The method includes the following steps: receiving, at a content addressable memory (CAM), N input signals to perform the multi-plane read operations on N memory planes, wherein N is an integer greater than 1; comparing, by N comparators in the CAM, the N input signals with a first old address stored in a set of CAM registers in the CAM; generating, by the N comparators in the CAM, N output enablement signals to indicate whether a respective input signal comprises an input address matching the first old address; and generating, by N multiplexers in the CAM, N output signals according to the N output enablement signals, wherein at least one of the N output signals directs to a new address stored in the set of CAM registers, wherein the new address corresponds to the first old address.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A content addressable memory (CAM) for repairing firmware of multi-plane read operations in a flash memory device, comprising:
    a set of CAM registers configured to store a mapping table, wherein the mapping table comprises a plurality of old addresses, each old address corresponding to a new address;
    N comparators coupling to the set of CAM registers, and configured to compare the plurality of old addresses with N input signals for performing the multi-plane read operations on N memory planes, wherein N is an integer greater than 1; and
    N multiplexers coupling to the N comparators respectively and to the set of CAM registers, and configured to generate N output signals for the multi-plane read operations, wherein at least one of the N output signals comprises a corresponding new address according to the mapping table and a comparison output by a corresponding comparator.

2. The CAM of claim 1, wherein each of the N comparators is further configured to:
    generate an output enablement signal; and
    send the output enablement signal to one of the N multiplexers.

3. The CAM of claim 2, wherein each of the N multiplexers is further configured to:
    receive a respective output enablement signal sent by a respective comparator; and
    receive a respective new address stored in the mapping table.

4. The CAM of claim 2, wherein the output enablement signal indicates a matching status when an input address in a respective input signal matches one of the plurality of old addresses.

5. The CAM of claim 4, wherein the output enablement signal indicates NULL when the input address in the respective input signal does not match any one of the plurality of old addresses.

6. The CAM of claim 4, wherein the input address in the respective input signal identifies a memory cell, a memory string, a memory page, a memory block or a memory plane in the flash memory device.

7. The CAM of claim 1, wherein the plurality of old addresses stored in the mapping table identify defective memory cells, defective memory strings, defective memory pages or defective memory blocks in the flash memory device.

8. The CAM of claim 1, wherein the new address stored in the mapping table identifies a redundant memory cell, a redundant memory string, a redundant memory page, a redundant memory block or a redundant memory plane in the flash memory device.

9. The CAM of claim 1, wherein the N input signals comprise a first plane index and a second plane index different from the first plane index, wherein the multi-plane read operations are directed simultaneously to a first memory page in a first memory plane with the first plane index and to a second memory page in a second memory plane with the second plane index.

10. The CAM of claim 1, wherein the flash memory device includes a three-dimensional NAND flash memory.

11. The CAM of claim 10, wherein the three-dimensional NAND flash memory comprises a plurality of memory strings vertically extending through a film stack of alternating conductive and dielectric layers, wherein the plurality of memory strings each comprises:
    a channel layer disposed on a sidewall of a core filling film; and
    a memory film disposed on a sidewall of the channel layer.

12. A flash memory device, comprising:
    M memory planes, wherein M is an integer greater than 1; and
    a control circuit coupling to the M memory planes by a word line driver and/or a bit line driver, wherein the control circuit comprises:
        M asynchronized multi-plane with independent page address (AMPI) read units, each configured to provide an AMPI read control signal for a respective memory plane of the M memory planes to control an AMPI read operation on the respective memory plane; and
        a content addressable memory (CAM), comprising a set of CAM registers shared by the M AMPI read units for repairing firmware of the AMPI read operation.

13. The flash memory device according to claim 12, wherein the MAMPI read units are microcontroller units (MCUs).

14. The flash memory device according to claim 12, wherein each of the M memory planes comprises a plurality of memory strings vertically extending through a film stack of alternating conductive and dielectric layers, wherein the plurality of memory strings each comprises:
    a channel layer disposed on a sidewall of a core filling film; and
    a memory film disposed on a sidewall of the channel layer.

15. The flash memory device according to claim 12, wherein the CAM further comprises M comparators, each comparator coupling to the set of CAM registers and configured to compare a plurality of old addresses stored in the set of CAM registers with the AMPI read control signal for the respective memory plane.

16. The flash memory device according to claim 15, wherein the plurality of old addresses identify defective memory cells, defective memory strings, defective memory pages, or defective memory blocks in the flash memory device.

17. The flash memory device according to claim 15, wherein the CAM further comprises M multiplexers, each multiplexer coupling to a respective comparator and to the set of CAM registers, and each multiplexer configured to generate an output signal for the AMPI read operation on the respective memory plane.

18. The flash memory device according to claim 17, wherein the output signal comprises a new address provided by the set of CAM registers identifying a redundant memory cell, a redundant memory string, a redundant memory page, or a redundant memory block in the flash memory device.

19. The flash memory device according to claim 17, wherein each comparator is further configured to:
- generate an output enablement signal indicating a matching status when an input address in the AMPI read control signal matches one of the plurality of old addresses; and
- send the output enablement signal to a respective multiplexer to generate the output signal for the AMPI read operation on the respective memory plane.

20. A memory storage system, comprising:
- a flash memory device, comprising:
  - M memory planes, wherein M is an integer greater than 1; and
  - a control circuit coupling to the M memory planes by a word line driver and/or a bit line driver, wherein the control circuit comprises:
    - M asynchronized multi-plane with independent page address (AMPI) read units, each configured to provide an AMPI read control signal for a respective memory plane of the M memory planes to control an AMPI read operation on the respective memory plane; and
    - a content addressable memory (CAM), comprising a set of CAM registers shared by the MAMPI read units for repairing firmware of the AMPI read operation.

* * * * *